United States Patent
Matsuo et al.

(10) Patent No.: US 8,486,828 B2
(45) Date of Patent: *Jul. 16, 2013

(54) SEMICONDUCTOR DEVICE MANUFACTURING METHOD

(75) Inventors: Kouji Matsuo, Yokohama (JP); Kazuhiko Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

This patent is subject to a terminal disclaimer.

(21) Appl. No.: 13/067,129

(22) Filed: May 11, 2011

(65) Prior Publication Data

US 2011/0212589 A1    Sep. 1, 2011

Related U.S. Application Data

(62) Division of application No. 12/485,429, filed on Jun. 16, 2009, now Pat. No. 7,981,795.

(30) Foreign Application Priority Data

Jun. 17, 2008 (JP) .................................. 2008-157730
Feb. 24, 2009 (JP) .................................. 2009-041177

(51) Int. Cl.
*H01L 21/44* (2006.01)

(52) U.S. Cl.
USPC .............. 438/664; 257/E21.19; 257/E21.165; 438/197; 438/586; 438/682; 438/686

(58) Field of Classification Search
USPC ............. 257/E21.19, E21.165; 438/197, 586, 438/664, 669, 682, 686
See application file for complete search history.

(56) References Cited

U.S. PATENT DOCUMENTS

| | | |
|---|---|---|
| RE32,613 E | 2/1988 | Lepselter et al. |
| 5,698,468 A | 12/1997 | Kapoor |
| 6,133,124 A | 10/2000 | Horstmann et al. |
| 6,383,906 B1 | 5/2002 | Wieczorek et al. |
| 7,981,795 B2 * | 7/2011 | Matsuo et al. ................ 438/664 |
| 2003/0222320 A1 | 12/2003 | Nozaki | |

FOREIGN PATENT DOCUMENTS

| | | |
|---|---|---|
| JP | 7-245277 | 9/1995 |
| JP | 9-116146 | 5/1997 |
| JP | 11-251591 | 9/1999 |
| JP | 2001-203352 | 7/2001 |
| JP | 2005-19705 | 1/2005 |

OTHER PUBLICATIONS

Matsuo et al., U.S. Appl. No. 12/409,092, filed Mar. 23, 2009.

(Continued)

*Primary Examiner* — Asok K Sarkar
(74) *Attorney, Agent, or Firm* — Finnegan, Henderson, Farabow, Garrett & Dunner, L.L.P.

(57) ABSTRACT

A semiconductor device manufacturing method has forming a metal film containing platinum by depositing a metal on a source/drain diffusion layer primarily made of silicon formed on a semiconductor substrate and on a device isolation insulating film; forming a silicide film by silicidation of an upper part of the source/drain diffusion layer by causing a reaction between silicon in the source/drain diffusion layer and the metal on the source/drain diffusion layer by a first heating processing; forming a metal oxide film by a oxidation processing to oxidize selectively at least a surface of the metal film on the device isolation insulating film; increasing the concentration of silicon in the silicide film by a second heating processing; and selectively removing the metal oxide film and an unreacted part of the metal film on the device isolation insulating film.

20 Claims, 13 Drawing Sheets

OTHER PUBLICATIONS

Notification of Reason for Rejection issued by the Japanese Patent Office on Jan. 18, 2013, for Japanese Patent Application No. 2009-041177, and English-language translation thereof.

Decision of Rejecton issued by the Japanese Patent Office May 7, 2013, for Japanese Patent Application No. 2000-041177, and English-language translation thereof.

* cited by examiner

SEMICONDUCTOR DEVICE MANUFACTURING METHOD

CROSS-REFERENCE TO RELATED APPLICATIONS

This is a division of application Ser. No. 12/485,429, filed Jun. 16, 2009, now U.S. Pat. No. 7,981,795, which is incorporated herein by reference.

This application is based upon and claims the benefit of priority from the prior Japanese Patent Application No. 2008-157730, filed on Jun. 17, 2008, and No. 2009-41177, filed on Feb. 24, 2009 the entire contents of which are incorporated herein by reference.

BACKGROUND OF THE INVENTION

1. Field of the Invention

The present invention relates to a semiconductor device manufacturing method for forming a silicide electrode of a metal insulator semiconductor field effect transistor (MISFET).

2. Background Art

Recently, miniaturization of semiconductor devices has been advancing. It requires size reduction of transistors in directions parallel to the surface of the semiconductor substrate, such as the gate dimensions, the width of the device isolation insulating film and the line width. It also requires size reduction in direction perpendicular to the surface of the semiconductor substrate, such as the height of the gate electrode and the junction depth of the source/drain diffusion layer.

On the other hand, it is desirable that a silicide film having a low resistance is formed on the gate electrode, the source/drain diffusion layer or the like to reduce the parasitic resistance of these regions.

To this end, the so-called self-aligned silicide (SALICIDE) process for forming a silicide film having a low resistance on the gate electrode, the surface of the source/drain diffusion layer or the like is adopted (see Japanese Patent Laid-Open Nos. 2005-19705 and 11-251591, for example).

SUMMARY OF THE INVENTION

According to one aspect of the present invention, there is provided: a semiconductor device manufacturing method for forming a MISFET, comprising:

forming a metal film containing platinum by depositing a metal on a source/drain diffusion layer primarily made of silicon formed on a semiconductor substrate and on a device isolation insulating film formed on the semiconductor substrate adjacent to the source/drain diffusion layer;

forming a silicide film by silicidation of an upper part of the source/drain diffusion layer by causing a reaction between silicon in the source/drain diffusion layer and the metal on the source/drain diffusion layer by a first heating processing at a first heating temperature;

forming a metal oxide film by a oxidation processing to oxidize selectively at least a surface of the metal film on the device isolation insulating film;

increasing the concentration of silicon in the silicide film by a second heating processing at a second heating temperature higher than the first heating temperature; and selectively removing the metal oxide film and an unreacted part of the metal film on the device isolation insulating film.

According to another aspect of the present invention, there is provided: a semiconductor device manufacturing method for forming a MISFET, comprising:

forming a metal film containing platinum by depositing a metal on a gate electrode primarily made of silicon formed on a semiconductor substrate with an gate insulate film interposed therebetween and on a first insulating film formed on the opposite sides of the gate electrode;

forming a silicide film by silicidation of an upper part of the gate electrode by causing a reaction between silicon in the gate electrode and the metal on the gate electrode by a first heating processing at a first heating temperature;

forming a metal oxide film by a oxidation processing to oxidize selectively at least a surface of the metal film on the device isolation insulating film;

increasing the concentration of silicon in the silicide film by a second heating processing at a second heating temperature higher than the first heating temperature; and selectively removing the metal oxide film and an unreacted part of the metal film on the device isolation insulating film.

According to still another aspect of the present invention, there is provided: a semiconductor device manufacturing method for forming a MISFET, comprising:

forming a metal film containing platinum by depositing a metal on a source/drain diffusion layer primarily made of silicon formed on a semiconductor substrate and on a device isolation insulating film formed on the semiconductor substrate adjacent to the source/drain diffusion layer and forming a silicide film by silicidation of an upper part of the source/drain diffusion layer by causing a reaction between silicon in the source/drain diffusion layer and the metal on the source/drain diffusion layer by a first heating processing at a first heating temperature;

forming a metal oxide film by a oxidation processing to oxidize selectively at least a surface of the metal film on the device isolation insulating film;

increasing the concentration of silicon in the silicide film by a second heating processing at a second heating temperature higher than the first heating temperature; and selectively removing the metal oxide film and an unreacted part of the metal film on the device isolation insulating film.

DETAILED DESCRIPTION

First, problems with the SALICIDE technique for the source and drain of the MISFET identified by the inventors through experiments will be described.

Comparison Example

Figure 1A:
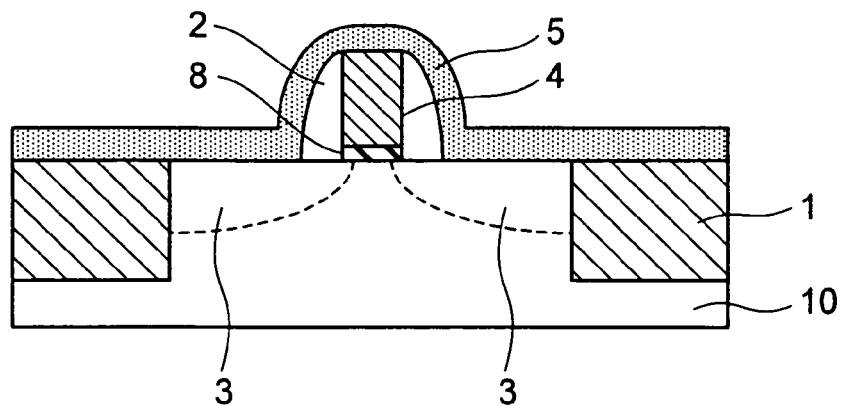
FIG. 1A is a cross-sectional view showing different step in a SALICIDE process for a MISFET in a comparison example.
Figure 1B:
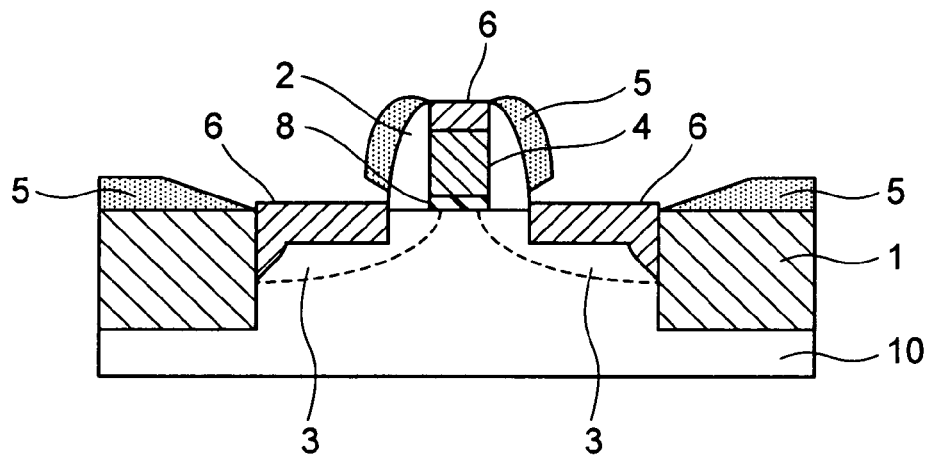
FIG. 1B is a cross-sectional view showing different step in a SALICIDE process for a MISFET in a comparison example.
Figure 1C:
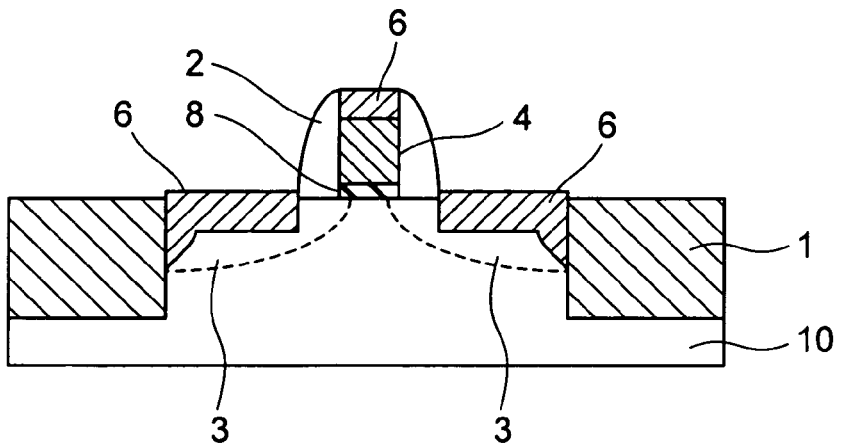
FIG. 1C is a cross-sectional view showing different step in a SALICIDE process for a MISFET in a comparison example.
Figure 2:
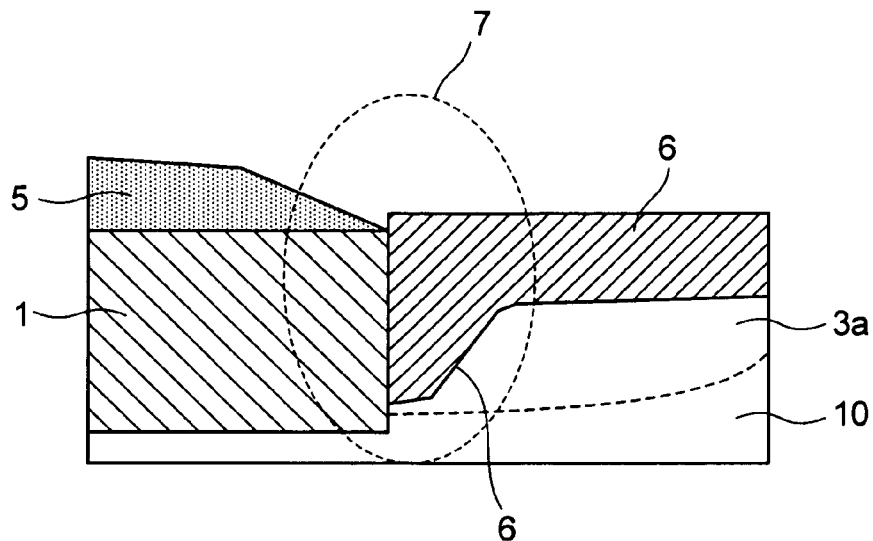
FIG. 2 is an enlarged view of a boundary between a device isolation region and a device region and the vicinity thereof in the step shown in FIG. 1B.

FIGS. 1A to 1C are cross-sectional views showing different steps in a SALICIDE process for a MISFET in a comparison example. FIG. 2 is an enlarged view of a boundary between a device isolation region and a device region and the vicinity thereof in the step shown in FIG. 1B. The SALICIDE process is a manufacturing method for selectively forming a silicide only on a part in which silicon (Si) is exposed on the surface.

First, a device isolation insulating film 1 made of an insulator, such as $SiO_2$ and SiN, is formed on a silicon substrate 10 primarily made of silicon, thereby forming a device region and a device isolation region. On the device region of the silicon substrate 10, a gate insulating film 8 of the MISFET and a gate electrode 4 made of polysilicon are stacked. The gate insulating film 8 and the gate electrode 4 are patterned by lithography, for example.

Then, an impurity is implanted into the device region to form source/drain diffusion layers 3 primarily made of silicon on the surface of the silicon substrate 10 so as to sandwich the gate electrode 4. Then, gate side walls 2 made of an insulator, such as $SiO_2$ and SiN, are formed on the opposite sides of the gate electrode 4.

Then, as shown in FIG. 1A, a metal film 5 for silicidation is formed on the surface of the device isolation insulating film 1 and the gate side walls 2 made of $SiO_2$, SiN or the like and the surface of the source/drain diffusion layers 3 and the gate electrode 4 on which Si is exposed.

Then, as shown in FIG. 1B, selective silicidation of an upper part of the source/drain diffusion layers 3 and an upper part of the gate electrode 4 is caused by a heating processing in a nitrogen atmosphere, for example, thereby forming a silicide film 6. On the other hand, the metal film 5 on the surface of the device isolation insulating film 1 and the surface of the gate side walls 2 that are made of $SiO_2$, SiN or the like remains unreacted.

Then, as shown in FIG. 1C, the unreacted metal on the surface of the device isolation insulating film 1 and the surface of the gate side walls 2 is removed with a chemical solution that dissolves the unreacted metal film 5 but does not dissolve the silicide film 6. As a result, the silicide film 6 is left only on the part in which Si is exposed.

The chemical solution can be aqua regia in the case where the silicide film 6 contains a noble metal, such as platinum (Pt) and palladium (Pd).

Next, as a specific example, problems that arise in the case where Ni silicide containing Pt is formed will be described.

Figure 3:
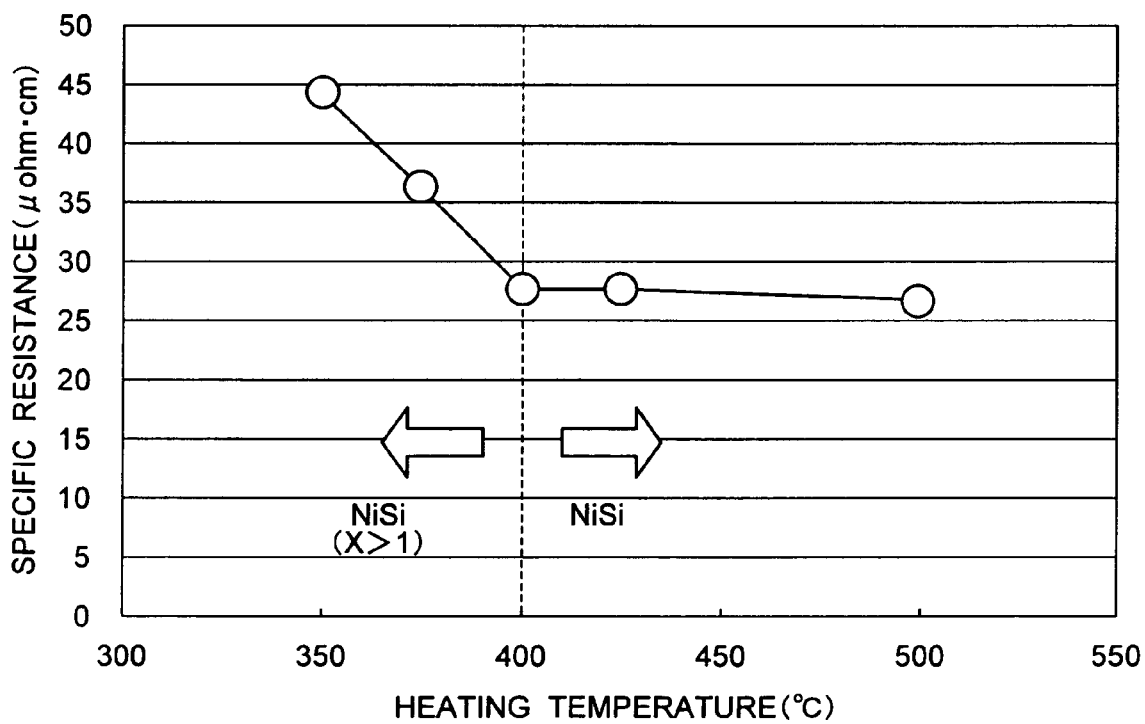
FIG. 3 is a graph showing a relationship between the specific resistance of a Ni silicide film containing PT formed on the silicon substrate and the temperature of the heating processing.

FIG. 3 is a graph showing a relationship between the specific resistance of a Ni silicide film containing PT formed on the silicon substrate and the temperature of the heating processing. In FIG. 3, the duration of the heating processing is 30 seconds, for example.

As can be seen from FIG. 3, in the case where the temperature of the heating processing is 400 degrees C. or higher, and the duration of the heating is 30 seconds, the composition of the Ni silicide changes from $Ni_xSi$ (X>1) to NiSi.

As described above, since the metal film 5 contains Pt, which is a noble metal, the chemical solution used for removing (etching) the metal film 5 in the step shown in FIG. 1C is aqua regia. It is essential to prevent the silicide film 6 formed on the source/drain diffusion layers 3 and the gate electrode 4 from being oxidized during the etching.

To this end, the heating processing in the step shown in FIG. 1B is carried out at a relatively high temperature, specifically, 400 degrees C. or higher to bring the value X of $Ni_xSi$ to as close to 1 as possible (FIG. 3). In other words, it is necessary to bring the composition of the Ni silicide close to NiSi, which has high resistance to oxidation.

For example, if the heating processing is carried out at a temperature lower than 400 degrees C., a Ni-rich silicide having a composition of $Ni_xSi$ (X>1) is formed as shown in FIG. 3, and the Ni-rich silicide is oxidized by aqua regia. In this case, the silicide film 6 cannot have a desired resistance value.

On the other hand, the heating processing at the high temperature described above (400 degrees C. or higher, for example) causes migration in the metal film (Ni) 5 on the device isolation insulating film 1 in a boundary part 7 between the device isolation region and the device region as shown in FIG. 2. Thus, at the boundary part 7, Ni migration occurs on the device isolation insulating film 1, and Ni flows into the source/drain diffusion layer 3. As a result, the silicide film 6 is thicker in the boundary part 7.

Thus, there is a problem that the junction leakage characteristics in the boundary part 7 on the side of the source/drain diffusion layer 3 are degraded.

Note that migration occurs also in the metal films (Ni) 5 on the gate side walls 2 during the heating processing. Thus, Ni on the gate side walls 2 on the opposite sides of the gate electrode 4 migrates into the gate electrode 4. As a result, the silicide film 6 formed on the gate electrode 4 is thicker in the opposite side parts thereof. This poses a problem that the characteristics of the MISFET (such as threshold voltage) vary.

Thus, the present invention provides a semiconductor device manufacturing method that relates to a SALICIDE technique that involves metallization of a source, a drain and a gate part of a MISFET and can solve the problems described above.

In the following, embodiments of the present invention will be described with reference to the drawings.

First Embodiment

In a first embodiment, an example of a semiconductor device manufacturing method that relates to a SALICIDE technique that involves metallization of a source, a drain and a gate part of a MISFET will be described. In the following, an exemplary process therefor will be schematically described.

1) As with the ordinary SALICIDE technique, a source/drain diffusion layer made of Si, SiGe, SiC or the like is formed, and a Ni film containing Pt is formed on the entire surface of the wafer.

2) A first heating processing is carried out to cause silicidation of Si, SiGe or the like in the source/drain diffusion layer to form a Ni silicide film.

3) An unreacted Ni film on a device isolation insulating film or the like is oxidized by heating in an oxidizing atmosphere to form a Ni oxide film.

4) A second heating processing is carried out at a temperature higher than in the first heating processing to change the composition of the Ni silicide film into a Si-rich composition.

5) The Ni oxide film and Pt are removed with aqua regia.

In a semiconductor device manufacturing method according to an aspect of the present invention, Ni on the device isolation insulating film is oxidized into a Ni oxide before the second heating process carried out at a higher temperature, thereby preventing Ni from flowing into the source/drain diffusion layer.

In this way, a desired silicide film is formed, and the junction leakage of the MISFET is reduced.

In the following, a semiconductor device manufacturing method for forming a MISFET according to the first embodiment will be described in detail by focusing on a SALICIDE process for a MISFET.

FIGS. 4A to 5B are cross-sectional views showing different steps in the semiconductor device manufacturing method according to the first embodiment.

First, as in the comparison example described above, a device isolation insulating film 1 made of an insulator, such as $SiO_2$ and SiN, is formed on a silicon substrate (semiconductor substrate) 10 primarily made of silicon, thereby forming a device region and a device isolation region. On the device region of the silicon substrate 10, a gate insulating film 8 of a MISFET and a gate electrode 4 made of polysilicon are stacked. The gate insulating film 8 and the gate electrode 4 are patterned by lithography, for example.

Then, an impurity is implanted into the device region to form source/drain diffusion layers 3 primarily made of silicon on the surface of the silicon substrate 10 so as to sandwich the gate electrode 4. Then, gate side walls (insulating films) 2 made of an insulator, such as $SiO_2$ and SiN, are formed on the opposite sides of the gate electrode 4. The source/drain diffusion layers 3 and the gate electrode 4 can contain germanium (Ge), carbon (C) or the like.

Figure 4A:
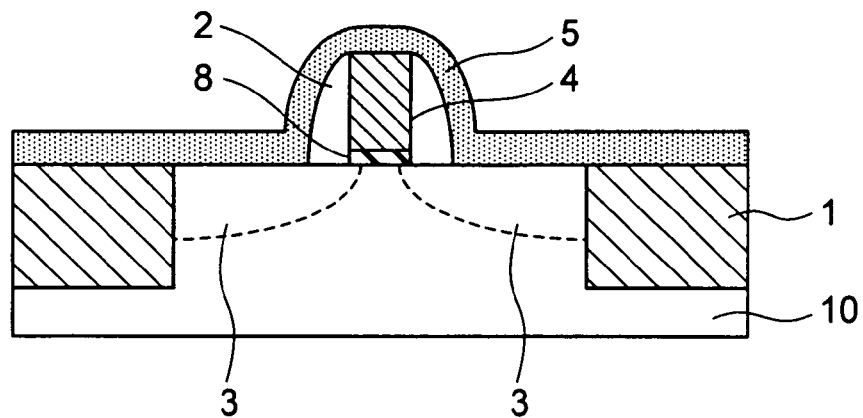
FIG. 4A is a cross-sectional view showing different step in the semiconductor device manufacturing method according to the first embodiment.

Then, as shown in FIG. 4A, by chemical vapor deposition (CVD) or the like, a metal is deposited on the surface of the device isolation insulating film 1 and the gate side walls 2 made of $SiO_2$, SiN or the like and the surface of the source/drain diffusion layers 3 and the gate electrode 4 on which Si is exposed. In this way, a metal film 5 for silicidation is formed.

In this embodiment, the metal for silicidation is nickel (Ni), for example. Alternatively, the metal can be cobalt, iron or titanium, for example.

Furthermore, the metal film 5 can contain a noble metal, such as platinum (Pt) and palladium (Pd). If the metal film 5 contains such a noble metal, the composition of the silicide film to be formed later can be more easily controlled to be a desired composition (NiSi, for example) by a heating processing.

In this embodiment, it is assumed that the metal film 5 contains Pt. In this case, the metal (Ni) deposited by CVD contains Pt.

Then, reaction between silicon in the source/drain diffusion layers 3 and the metal (Ni) on the source/drain diffusion layers 3 is caused by a first heating processing h1 at a first heating temperature ht1 (300 degrees C., for example). This reaction is silicidation of an upper part of the source/drain diffusion layers 3 and forms a silicide film 106.

Figure 4B:
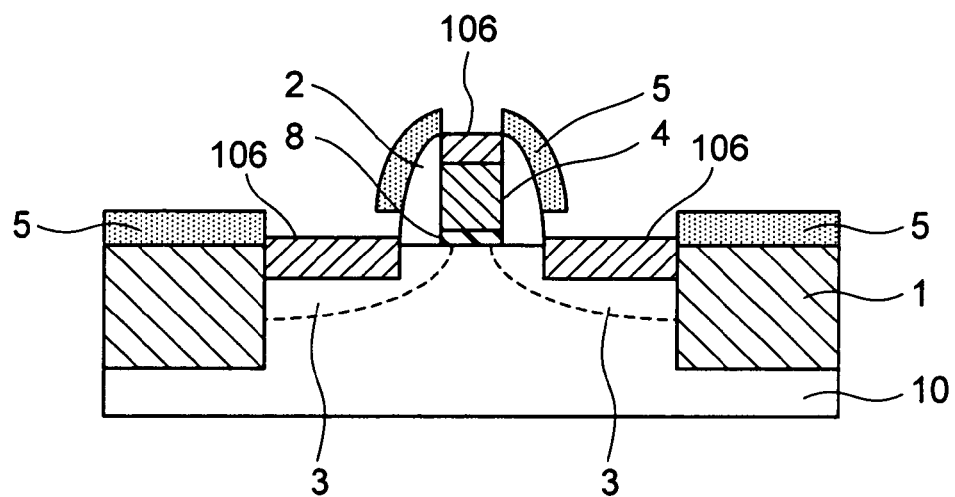
FIG. 4B is a cross-sectional view showing different step in the semiconductor device manufacturing method according to the first embodiment.

Besides, the first heating processing h1 causes reaction between silicon in the gate electrode 4 and the metal (Ni) on the gate electrode 4. This reaction is silicidation of an upper part of the gate electrode 4 and forms a silicide film 106 (FIG. 4B).

The first heating processing h1 is carried out in a nitrogen atmosphere, for example. Thus, the silicide film (Ni silicide) 106 containing Pt is selectively formed on the source/drain diffusion layers 3 and the gate electrode 4, whereas the metal film (Ni) 5 on the surface of the device isolation insulating film 1 and the gate side walls 2 remains unreacted.

In the comparison example, the heating processing has to be carried out at approximately 400 degrees C. or higher to prevent the Ni silicide from being oxidized by aqua regia.

However, according to the first embodiment, the first heating temperature ht1 of the first heating processing h1 is set at a temperature that does not cause migration in the metal (Ni) film 5, for example, a temperature lower than 400 degrees C., preferably, about 300 degrees C. That is, the first heating temperature ht1 is lower than the temperature of the heating processing in the comparison example.

Therefore, Ni on the surface of the device isolation insulating film 1 and the gate side walls 2 can be prevented from migrating into the source/drain diffusion layers 3 and the gate electrode 4. That is, the unwanted increase in thickness of the silicide film in the comparison example shown in FIG. 2 can be prevented.

On the other hand, since the first heating processing h1 is a low temperature heat processing (300 degrees C., for example), the composition $Ni_xSi$ of the silicide film is a Si-rich composition (X>1) as shown in FIG. 3 as described above.

Figure 4C:
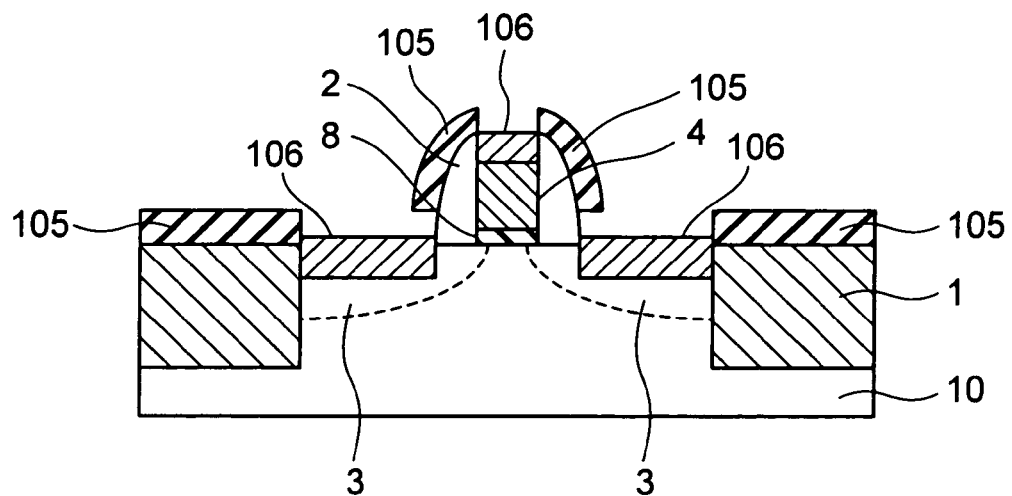
FIG. 4C is a cross-sectional view showing different step in the semiconductor device manufacturing method according to the first embodiment.

Then, at least the surface of the metal film 5 on the surface of the device isolation insulating film 1 and the gate side walls 2 is selectively oxidized (subjected to an oxidation processing) while preventing oxidation of the silicide film 106, thereby forming a metal oxide film 105 as shown in FIG. 4C.

Specifically, for example, an oxidation processing (thermal oxidation) is carried out in an oxidizing atmosphere at about 300 degrees C., thereby oxidizing unreacted Ni on the surface of the device isolation insulating film 1 and the gate side walls 2 to form a Ni oxide film. In this processing, the whole of the unreacted metal (Ni) film 5 can be oxidized to form the metal oxide film, or only a surface part of the unreacted metal (Ni) film 5 can be oxidized to form the metal oxide film. The amount of the unreacted metal film 5 oxidized to form the metal oxide film can be determined based on the extent to which the thickness of the silicide film 106 in the vicinity of the boundary is reduced.

The oxidation processing is preferably carried out under such a condition that the silicide formed on the source/drain diffusion layers 3 is not oxidized, or is only slightly oxidized to the extent that the specific resistance of the silicide film 106 is not affected by the oxidation. The thermal oxidation processing at about 300 degrees C. described above meets the condition.

By forming the metal oxide film 105 by oxidizing at least the surface of the metal film 5 as described above, occurrence of migration of the metal (Ni) in a subsequent heating processing can be prevented.

For the oxidation processing, oxidation using a chemical solution containing an oxidant, such as ozone ($O_3$) water, (wet oxidation) can be used. Alternatively, oxidation using plasma oxygen can also be used for the oxidation processing. These processes can produce the metal oxide film 105 at a lower temperature than the thermal oxidation and thus can more effectively prevent oxidation of the silicide film 106.

To prevent oxidation of the silicide film 106 formed on the source/drain diffusion layers 3, it is essential that the metal film 5 contain Pt. In the following, a reason therefor will be described in detail.

Figure 6:
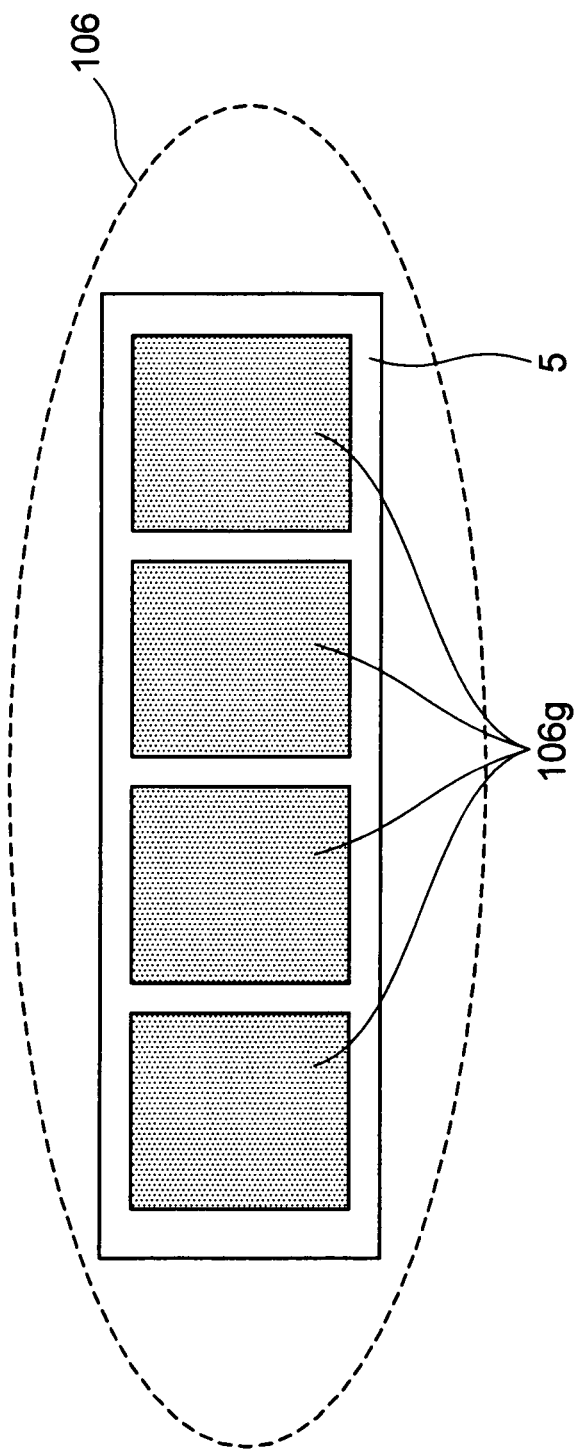
FIG. 6 is a schematic diagram showing the silicide film 106 having a Ni-rich composition in a crystalline state formed on the source/drain diffusion layers 3.

FIG. 6 is a schematic diagram showing the silicide film 106 having a Ni-rich composition in a crystalline state formed on the source/drain diffusion layers 3.

As shown in FIG. 6, since the metal film 5 contains Pt, Pt or Pt silicide is deposited on the grain boundaries between crystal grains 106g and the surface of the crystal grains 106g of the silicide film 106 having a Ni-rich composition in a self-aligned manner. The Pt or Pt silicide deposited on the surface of the crystal grains 106g forms a protective film against oxidation. The protective film is formed on the entire surface of the silicide film 106 in a self-aligned manner.

Thus, the protective film prevents the surface of the crystal grains 106g of the silicide film 106 having a Ni-rich composition from being oxidized in the oxidation processing at about 300 degrees C. in the step shown in FIG. 4C.

That is, although the temperature of the first heating processing h1 is a low temperature of about 300 degrees C., Pt contained in the silicide film 106 having a Ni-rich composition helps to prevent oxidation of the surface of the crystal grains 106g of the silicide film 106 in the oxidation processing.

As described above, if the silicide film 106 having a Ni-rich composition contains Pt, the temperature of the first heating processing h1 can be reduced to about 300 degrees C.

Thus, according to this embodiment, thickening of the Ni silicide film in the source/drain diffusion layer 3 at the device isolation boundary because of the migration of Ni on the device isolation region into the source/drain part, which occurs in the comparison example described above, can be prevented.

However, if the processing with aqua regia is carried out immediately after the oxidation processing described above, the Ni-rich silicide film 106 on the source/drain diffusion layer 3 is oxidized.

Figure 5A:
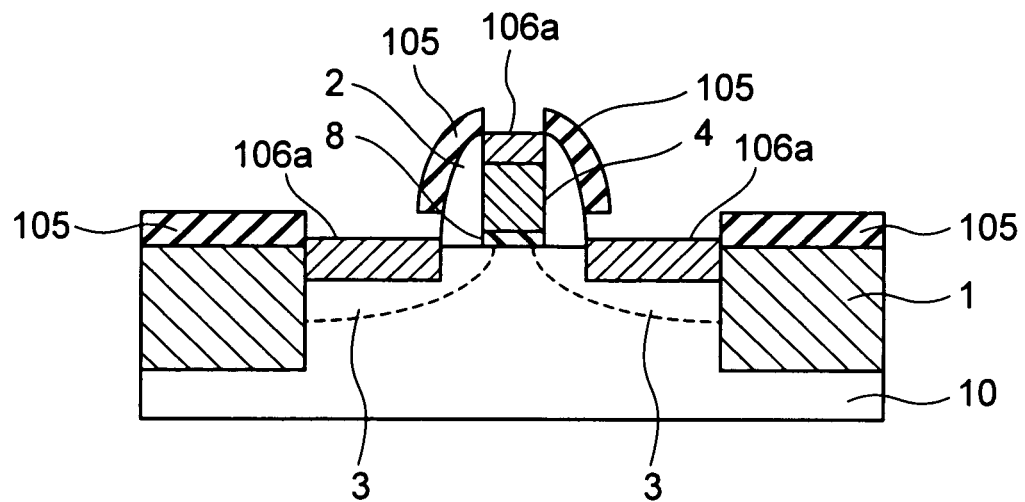
FIG. 5A is a cross-sectional view showing different step in the semiconductor device manufacturing method according to the first embodiment.

Thus, as shown in FIG. 5A, the silicon concentration of the silicide film is raised by the second heating processing h2 at the second heating temperature ht2 (400 degrees C., for example) higher than the first heating temperature ht1 (300 degrees C., for example). Specifically, the composition $Ni_xSi$ (X>1) of the silicide film is brought close to NiSi, which has a higher resistance to oxidation. In this way, the silicide film 106 is changed into a silicide film 106a having a higher silicon concentration.

Besides, as described above, according to the first embodiment, the metal (Ni) on the surface of the device isolation insulating film 1 and the gate side walls 2 exists in the form of the metal oxide film 105, so that migration thereof into the source/drain diffusion layer 3 and the gate electrode 4 is prevented.

As described above, after the unreacted Ni on $SiO_2$ or SiN is changed into the Ni oxide film, the second heating processing h2 at the higher temperature is carried out.

Figure 5B:
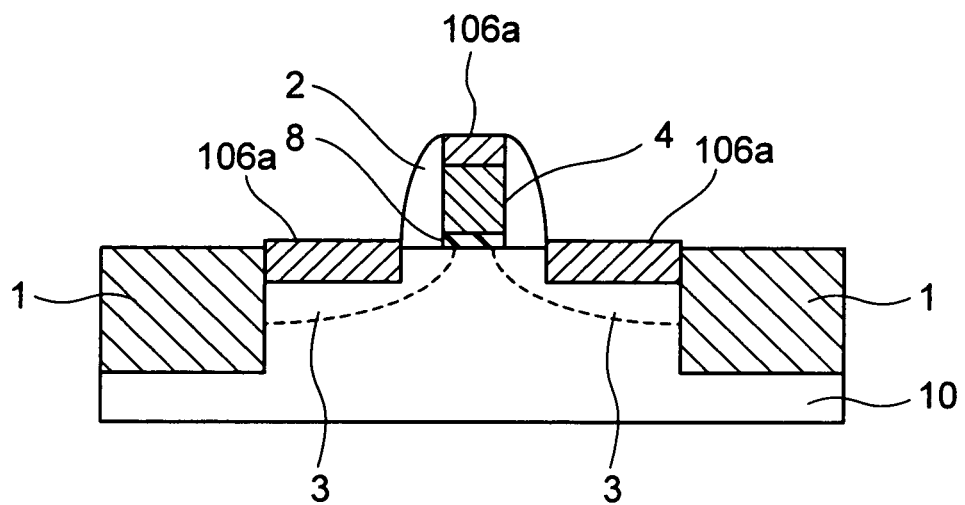
FIG. 5B is a cross-sectional view showing different step in the semiconductor device manufacturing method according to the first embodiment.

Then, as shown in FIG. 5B, the metal oxide film 105 and the unreacted part of the metal film 5 (not shown) on the surface of the device isolation insulating film 1 and the surface of the gate side walls 2 are selectively removed.

Specifically, the metal oxide film 105 and the unreacted part of the metal film 5 on the surface of the device isolation insulating film 1 and the surface of the gate side walls 2 are removed using a chemical solution that dissolves the metal oxide film 105 and the unreacted metal film 5 but does not dissolve the silicide film 106a. For example, the chemical solution can be aqua regia in the case where the silicide film 106a contains a noble metal, such as platinum (Pt) and palladium (Pd). If the silicide film 106a contains no noble metal, the chemical solution can be nitric acid-hydrogen peroxide ($HNO_3+H_2O_2$), hydrochloric acid-hydrogen peroxide ($HCl+H_2O_2$), or sulfuric acid-hydrogen peroxide ($H_2SO_4+H_2O_2$).

At this point, the silicide film 106a is a Si-rich silicide formed by the second heating processing h2 shown in FIG. 5A or, more specifically, has a composition close to NiSi. Therefore, the silicide film 106a is not oxidized by aqua regia.

According to the process described above, migration of the metal for silicidation can be prevented, and the silicide film having a desired thickness can be formed. Thus, degradation of the junction leakage characteristics can be prevented, and a MISFET having desired characteristics can be produced.

The steps shown in FIGS. 4B to 5A described above are a heating processing in a nitrogen atmosphere at a temperature lower than 400 degrees C., an oxidation processing at about 300 degrees C., and a heating processing in a nitrogen atmosphere at 400 degrees C. or higher, respectively. Therefore, these steps can be carried out as one sequential processing (in other words, can be carried out in the same chamber).

For example, after the step shown in FIG. 4B, the wafer is introduced into a heating processing chamber, and the first heating processing h1 is carried out in a nitrogen atmosphere at a temperature lower than 400 degrees C., for example, 300 degrees C. Then, oxygen gas is introduced into the same chamber to carry out the oxidation processing.

Then, while continuing introducing the oxygen gas into the nitrogen atmosphere, the temperature in the chamber is raised to 400 degrees C. or higher to carry out the second heating processing h2.

In this way, the processings in the steps shown in FIGS. 4B to 5A can be carried out as one processing (in the same chamber).

Although the first heating processing h1 in the step shown in FIG. 4B is carried out in a nitrogen atmosphere at a temperature lower than 400 degrees C. (300 degrees C., for example), the processing can also be carried out in an atmosphere containing oxygen as described below.

The object of the first heating processing h1 is to selectively form Ni silicide on the source/drain diffusion layer. This object can be attained by carrying out the heating processing by adjusting the oxygen concentration and the heating processing temperature so that the rate of reaction of Ni with Si or Ge is faster than the rate of oxidation of Ni.

Specifically, the first heating processing h1 can be carried out at 300 degrees C. and with an oxygen concentration of 1% or lower. By allowing for the oxygen concentration of up to 1%, the time required for nitrogen replacement in the chamber can be reduced when the processing carried out in one apparatus (in the same chamber) is switched to the following oxidation processing in the step shown in FIG. 4C.

Similarly, the high temperature nitrogen atmosphere at 400 degrees C. or higher in which the second heating processing h2 is carried out in the step shown in FIG. 5A can contain oxygen.

In particular, the inventors have confirmed that the silicide on the source and the drain is hardly oxidized even if the second heating processing h2 in the step shown in FIG. 5A is carried out in a 100% oxygen atmosphere.

Therefore, the processings in the steps shown in FIGS. 4C and 5A can be carried out in the same oxidizing atmosphere at different temperatures.

According to the heating processing sequence described above, the processings in the steps shown in FIGS. 4B to 5A can be carried out as one processing (in the same chamber).

Figure 7:
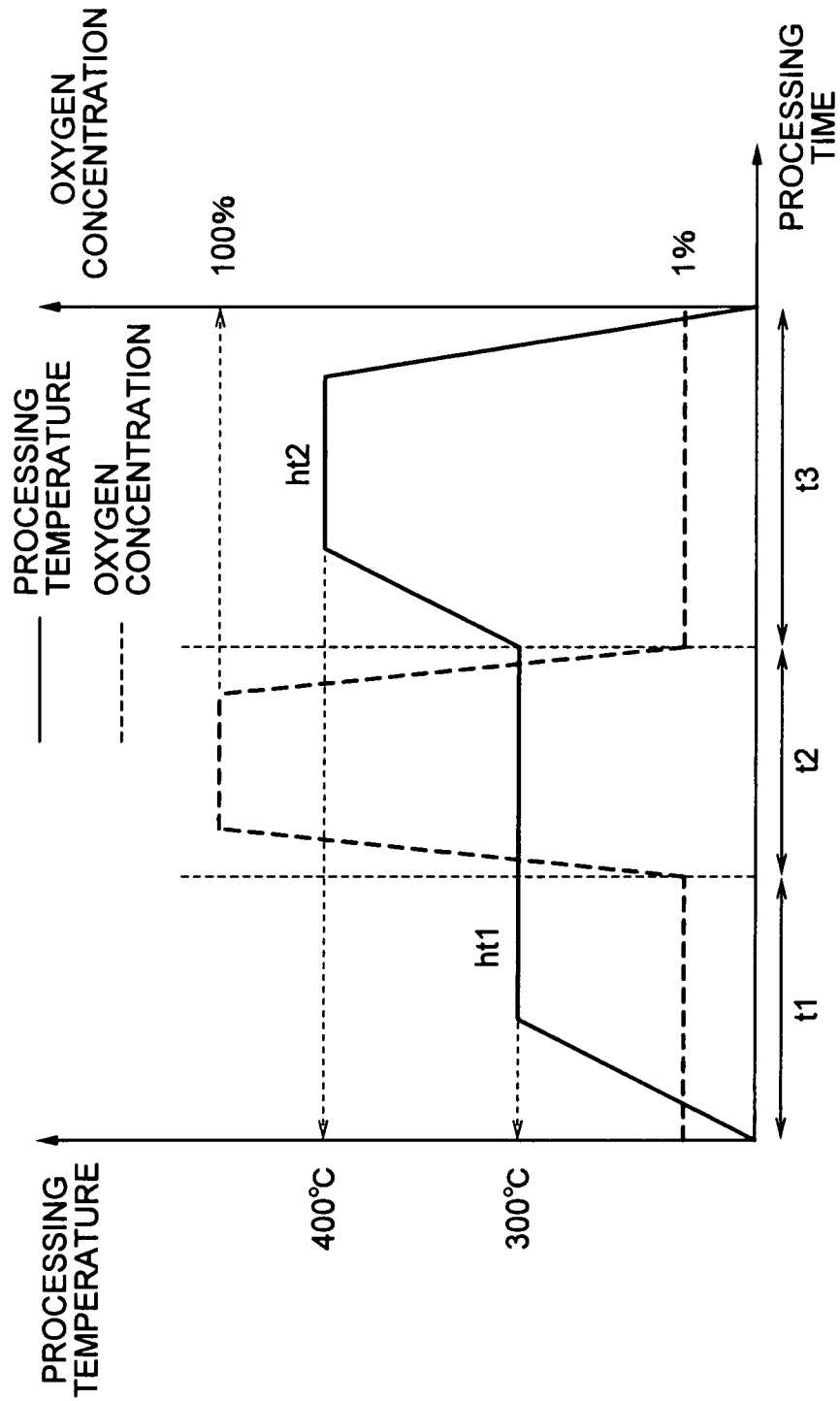
FIG. 7 is a diagram for illustrating an exemplary flow of the processings in the steps shown in FIGS. 4B to 5A carried out in the same chamber.

FIG. 7 is a diagram for illustrating an exemplary flow of the processings in the steps shown in FIGS. 4B to 5A carried out in the same chamber.

In FIG. 7, the abscissa indicates the time from the start of the processing, the left ordinate indicates the temperature, and the right ordinate indicates the oxygen concentration.

As shown in FIG. 7, first, in the time period t1, the first heating processing h1 (the step shown in FIG. 4B) is carried out at about 300 degrees C. and with an oxygen concentration of 1% or lower.

Then, in the time period t2, the oxidation processing (the step shown in FIG. 4C, specifically, thermal oxidation in this embodiment) is carried out at about 300 degrees C. and with an oxygen concentration of 100%, for example.

Then, in the time period t3, the second heating processing h2 (the step shown in FIG. 5A) is carried out at 400 degrees C. or higher and with an oxygen concentration of 1%, for example. However, the oxygen concentration can be any value from 1% to 100%.

After that, in the step shown in FIG. 5B, the metal oxide film 105 and the unreacted part of the metal film 5 (not shown) on the surface of the device isolation insulating film 1 and the surface of the gate side walls 2 are selectively removed.

As in the case described above, according to the process described above, migration of the metal for silicidation can be prevented, and the silicide film having a desired thickness can be formed. Thus, degradation of the junction leakage characteristics can be prevented, and a MISFET having desired characteristics can be produced.

As described above, according to the semiconductor device manufacturing method according to this embodiment, a silicide film having a desired thickness can be formed, and in particular, the junction leakage of a MISFET can be reduced.

According to this embodiment, it is essential only that the unreacted metal on the device isolation insulating film or the like is oxidized while preventing oxidation of the silicide film on the source/drain diffusion layer. Therefore, the metal is not limited to Ni or the like described above, and any metal that forms a metal oxide can be used. In addition, any metal that allows formation of a protective film containing Pt or Pd on the surface of the silicide film can be used.

Second Embodiment

In the first embodiment, a problem that arises from flowing of the metal (Ni) on the device isolation insulating film into the source/drain diffusion layer has been described in particular.

However, the problem can arise also in the case where a silicide film is formed on a gate electrode of a MISFET memory cell transistor in a NAND type flash memory by the SALICIDE process, for example.

In the second embodiment, a semiconductor device manufacturing method that solves the problem will be described by focusing on the case where a silicide film is formed on a gate electrode by the SALICIDE process.

FIGS. 8A to 10 are cross-sectional views for illustrating different steps in a semiconductor device manufacturing method according to the second embodiment.

Figure 8A:
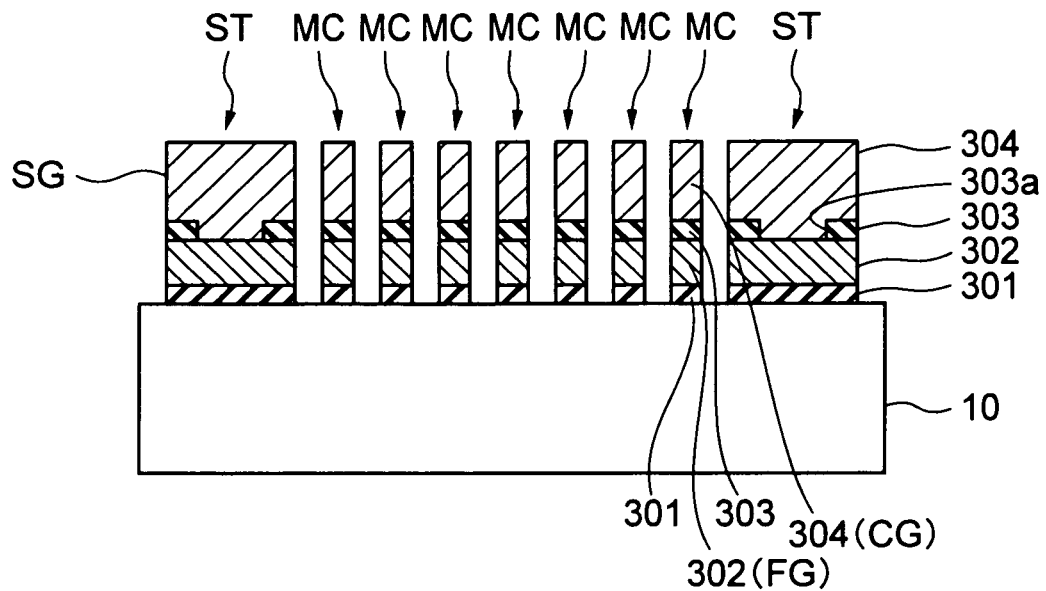
FIG. 8A is a cross-sectional view for illustrating different step in a semiconductor device manufacturing method according to the second embodiment.

As shown in FIG. 8A, first, on a tunnel insulating film 301 formed on a semiconductor substrate 10, a floating gate electrode (FG) 302 made of polysilicon, for example, for accumulating electric charges is formed. On the floating gate electrode 302, a control gate electrode (CG) 304 made of polysilicon is formed with an insulating film 303 interposed therebetween.

These electrodes are patterned to form memory cell transistors "MC" having a minimum gate length to which charges are written and select gate transistors "ST" having a larger gate length. In the select gate transistor "ST", the polysilicon forming the floating gate electrode 302 and the polysilicon forming the control gate electrode 304 are connected to each other through an opening 303a in the insulating film 303 to serve as a select gate electrode "SG".

Figure 8B:
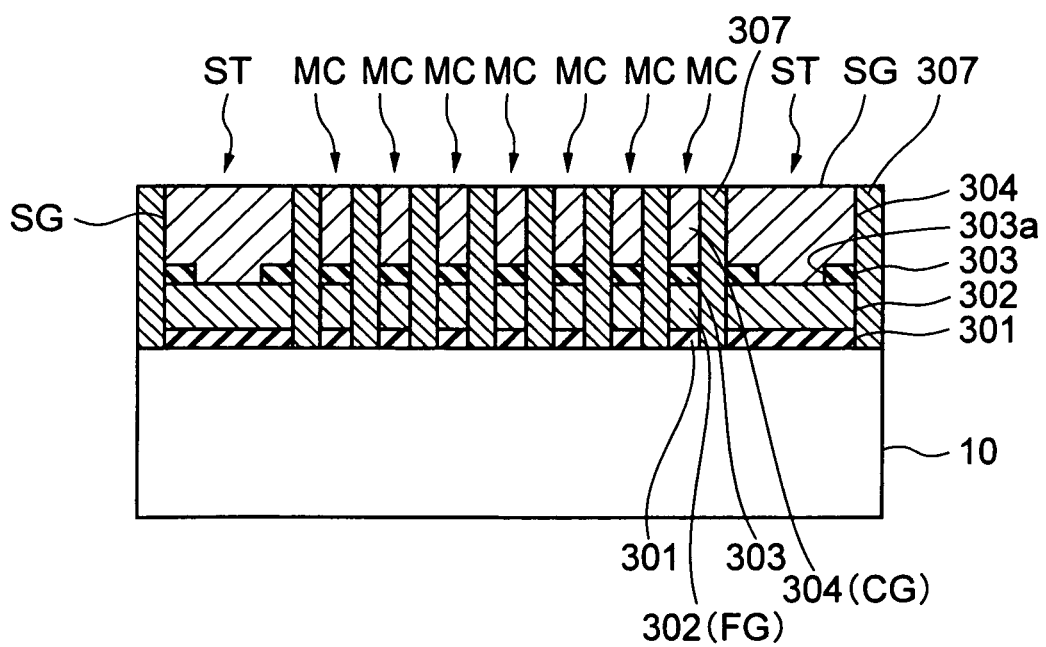
FIG. 8B is a cross-sectional view for illustrating different step in a semiconductor device manufacturing method according to the second embodiment.

Then, as shown in FIG. 8B, interlayer insulating films 307 are formed between the side surfaces of the gate electrodes by filling the spaces between the gate electrodes with an insulating film of $SiO_2$, SiN or the like by CVD or the like. Furthermore, the interlayer insulating films 307 are planarized by chemical mechanical polishing (CMP) or the like. In this way, a structure in which the upper part of the control gate electrodes (CG) and the upper part of the select gate electrodes (SG) are exposed is formed.

Figure 9A:
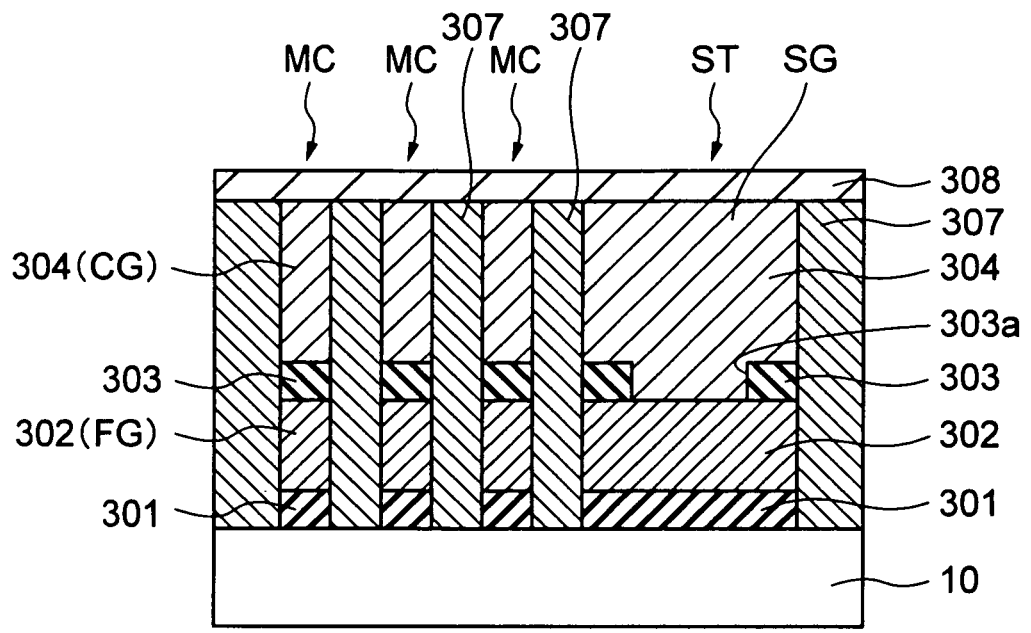
FIG. 9A is a cross-sectional view for illustrating different step in a semiconductor device manufacturing method according to the second embodiment.

Then, as shown in FIG. 9A, a metal film 308 of a metal for silicidation of the upper part of the gate electrodes, such as NiPt, is formed on the control gate electrodes "CG", the select gate electrodes "SG" and the interlayer insulating films 307.

In this embodiment, the metal for silicidation can also be cobalt, iron, titanium or the like.

In addition, the metal film 308 can contain another noble metal, such as palladium (Pd), instead of platinum (Pt). In that case, the composition of the silicide film to be formed later can be more easily controlled to be a desired composition (NiSi, for example) by a heating processing.

Figure 11A:
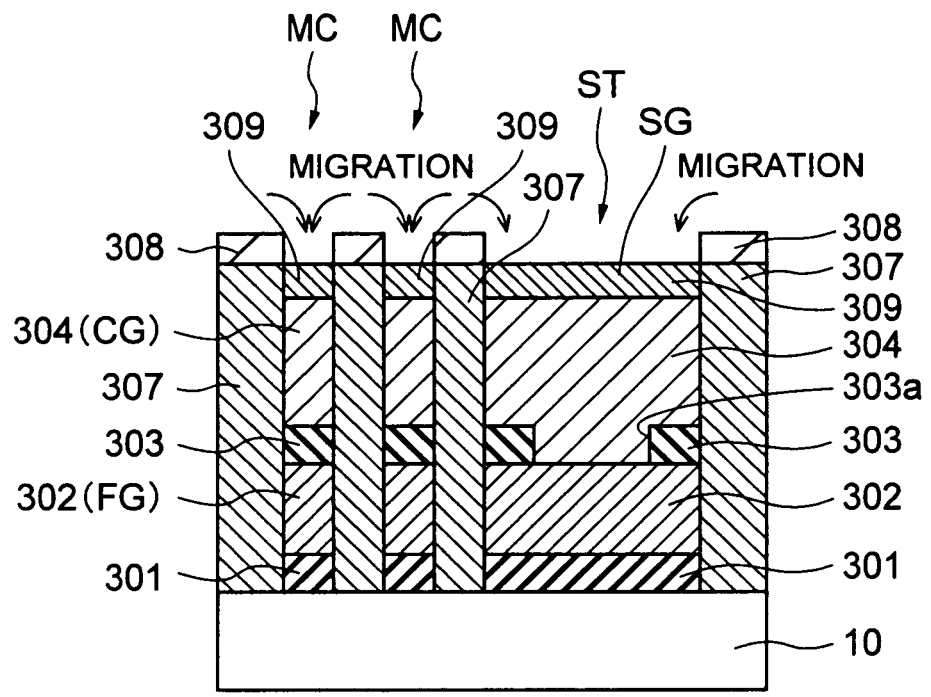
FIG. 11A is a cross-sectional view for illustrating a step of forming a metal film (NiPt) on the gate electrodes by using the SALICIDE process in the semiconductor device manufacturing method in the comparison example.
Figure 11B:
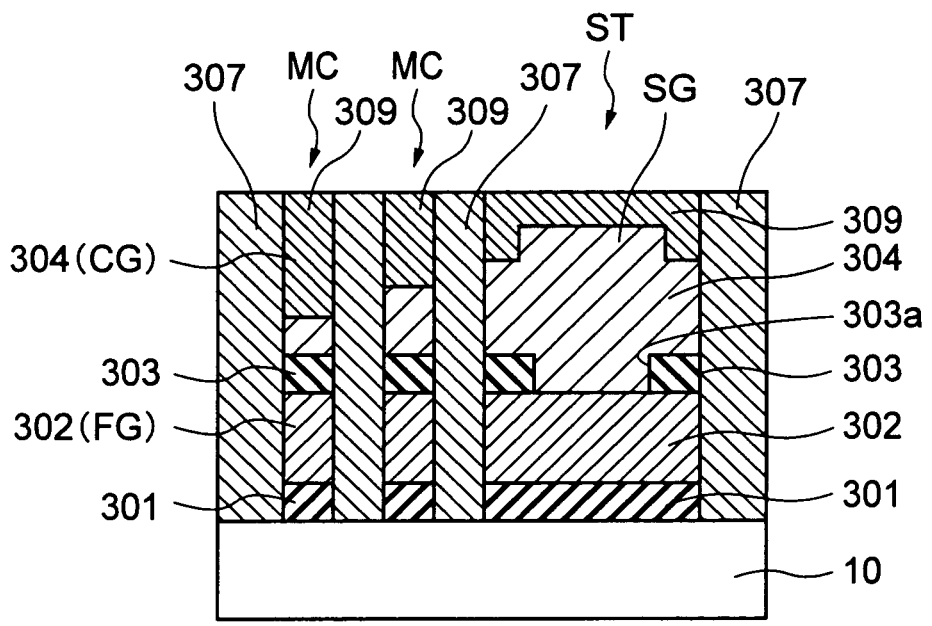
FIG. 11B is a cross-sectional view for illustrating a step of forming a metal film (NiPt) on the gate electrodes by using the SALICIDE process in the semiconductor device manufacturing method in the comparison example.

FIGS. 11A and 11B are cross-sectional views for illustrating a step of forming a metal film (NiPt) on the gate electrodes by using the SALICIDE process in the semiconductor device manufacturing method in the comparison example.

According to the method in the comparison example, the heating processing for silicidation that is carried out after the step shown in FIG. 9A requires a temperature of about 400 degrees C. Therefore, migration occurs in the metal film (NiPt) 308 on the interlayer insulating films 307, and the metal flows into the gate electrodes (FIG. 11A).

Therefore, in the region of the memory cell transistors "MC" having a small gate length, for example, a silicide film (NiSi) 309 is wholly thickened as a result of the heating processing. On the other hand, in the region of the select gate transistors "ST" having a large gate length, for example, only edge parts of the silicide film 309 are thickened as a result of the heating processing (FIG. 11B).

Thus, when the silicide film (NiSi) 309 having an optimal thickness is formed in the select gate transistors "ST", the silicide film (NiSi) 309 formed in the memory cell transistors "MC" has an excessively large thickness. As a result, a problem arises that the silicide film 309 made of NiSi reaches the insulating film 303 to change the threshold of the memory cell transistors "MC".

Figure 9B:
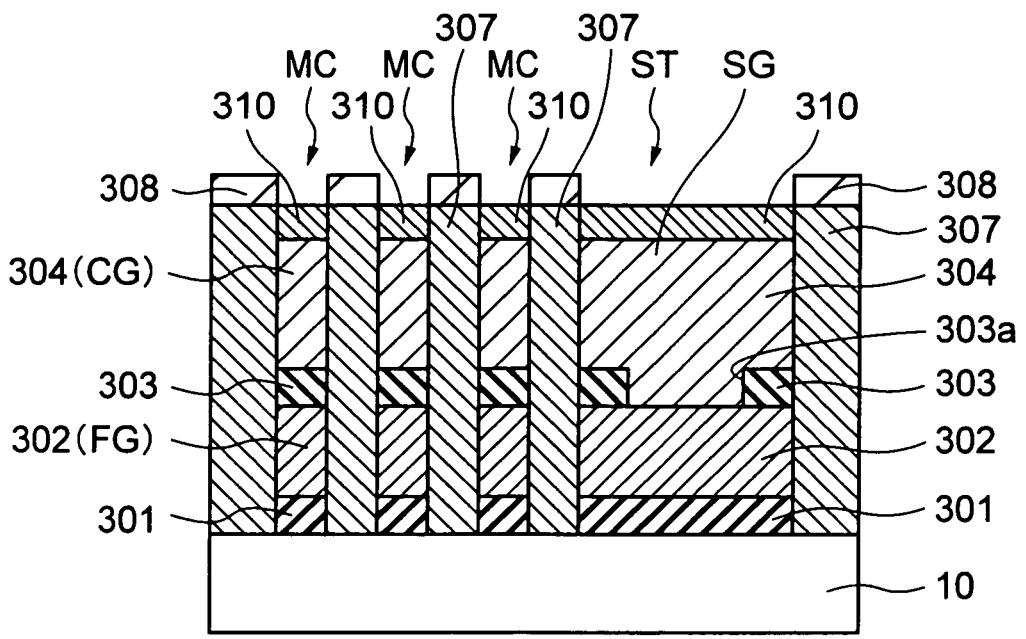
FIG. 9B is a cross-sectional view for illustrating different step in a semiconductor device manufacturing method according to the second embodiment.

Thus, according to the second embodiment, as in the first embodiment, after the step shown in FIG. 9A, the first heating processing h1 at the first heating temperature (about 300 degrees C.) that does not cause migration in the metal film (NiPt) 308 on the interlayer insulating film 307 is carried out. By this processing, a silicide film 310 having a composition $Ni_xSi$ (X>1) is formed (FIG. 9B).

Then, unreacted NiPt is oxidized to prevent migration from being caused by the subsequent second heating processing h2. Then, the second heating processing h2 at the second heating temperature (400 degrees C. or higher) is carried out. By this processing, the silicon concentration of the silicide film 310 is raised. That is, the composition $Ni_xSi$ (X>1) of the silicide film 310 is brought close to NiSi, which has a higher resistance to oxidation.

In this way, migration of NiPt on the interlayer insulating films 307 into the gate electrodes can be prevented.

Figure 10:
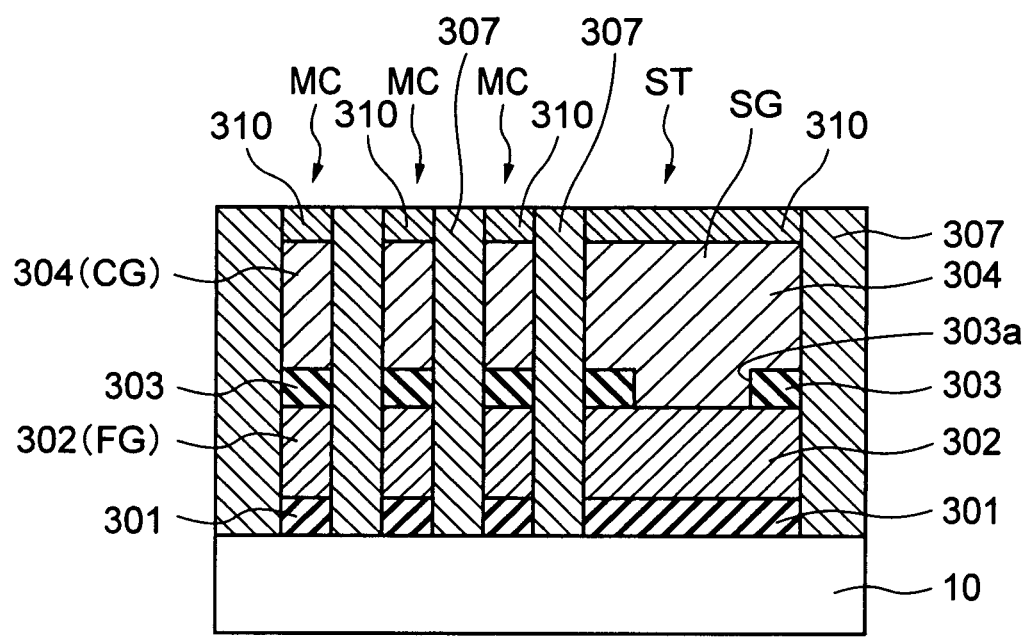
FIG. 10 is a cross-sectional views for illustrating different step in a semiconductor device manufacturing method according to the second embodiment.

Then, finally, Ni and Pt oxidized by aqua regia are selectively removed in such a manner that the silicide film (NiSi) is not removed. In this way, silicide films having an equal thickness can be formed on the gate electrodes of the memory cell transistor and the select gate transistor that have different gate lengths (FIG. 10).

As described above, according to the semiconductor device manufacturing method according to this embodiment, a silicide film having a desired thickness can be formed, and a desired threshold voltage of a memory cell transistor in a NAND type flash memory can be achieved.

Third Embodiment

In the first embodiment, there has been described a method of causing reaction between silicon in the source/drain diffusion layer 3 and the metal (Ni) on the source/drain diffusion layer 3 by the first heating processing h1 after the metal film (NiPt) is formed.

In a third embodiment, there will be described a method of causing reaction between silicon in the source/drain diffusion layer 3 and the metal (Ni) on the source/drain diffusion layer 3 by the first heating processing at the first heating temperature ht1 during formation of the metal film (NiPt) 5.

Figure 12:
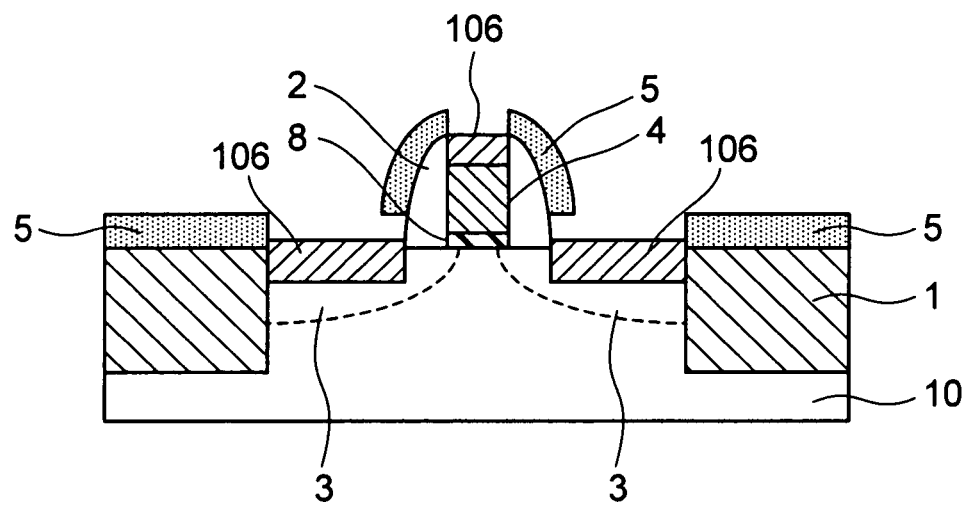
FIG. 12 is a cross-sectional view for illustrating different step in a semiconductor device manufacturing method according to the third embodiment.
Figure 13:
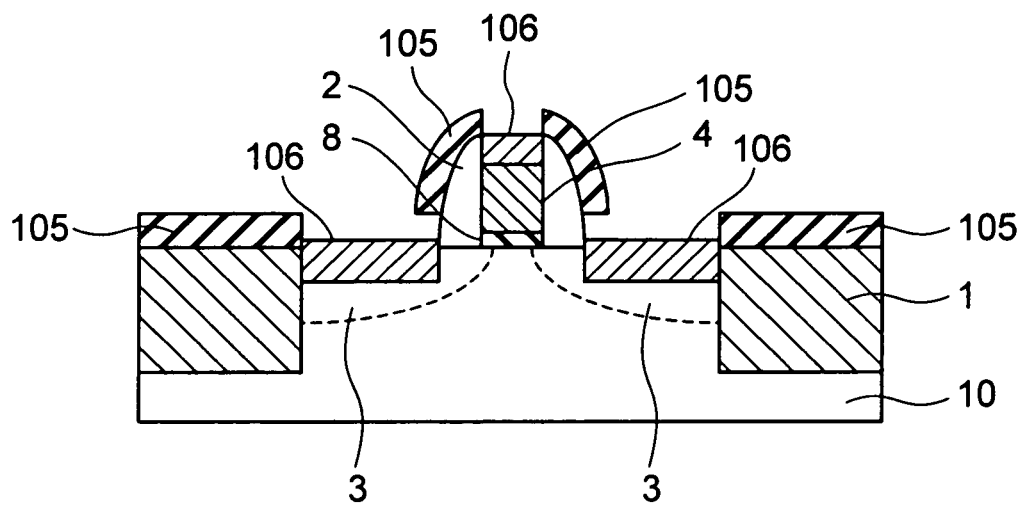
FIG. 13 is a cross-sectional view for illustrating different step in a semiconductor device manufacturing method according to the third embodiment.

FIGS. 12 and 13 are cross-sectional views for illustrating different steps in a semiconductor device manufacturing method according to the third embodiment.

First, as in the first embodiment, a device isolation insulating film 1 made of an insulator, such as $SiO_2$ and SiN, is formed on a silicon substrate (semiconductor substrate) 10 primarily made of silicon, thereby forming a device region and a device isolation region. On the device region of the silicon substrate 10, a gate insulating film 8 of a MISFET and a gate electrode 4 made of polysilicon are stacked. The gate insulating film 8 and the gate electrode 4 are patterned by lithography, for example.

Then, an impurity is implanted into the device region to form source/drain diffusion layers 3 primarily made of silicon on the surface of the silicon substrate 10 so as to sandwich the gate electrode 4. Then, gate side walls 2 made of an insulator, such as $SiO_2$ and SiN, are formed on the opposite sides of the gate electrode 4. The source/drain diffusion layers 3 and the gate electrode 4 can contain germanium (Ge), carbon (C) or the like.

Then, as shown in FIG. 12, a metal is deposited by sputtering, for example, on the surface of the device isolation insulating film 1 and the gate side walls 2 made of $SiO_2$, SiN or the like and the surface of the source/drain diffusion layers 3 and the gate electrode 4 on which Si is exposed. In this way, a metal film 5 for silicidation is formed.

In addition, during the deposition of the metal film 5 by sputtering, reaction between silicon in the source/drain diffusion layers 3 and the metal (Ni) on the source/drain diffusion layers 3 is caused by a first heating processing h1 at a first heating temperature ht1 (300 degrees C., for example). This reaction is silicidation of an upper part of the source/drain diffusion layers 3 and forms a silicide film 106.

Furthermore, the first heating processing h1 causes reaction between silicon in the gate electrode 4 and the metal (Ni) on the gate electrode 4. This reaction is silicidation of an upper part of the gate electrode 4 and forms a silicide film 106 (FIG. 12). In the case where the metal is completely changed into a silicide, the number of heating processing steps is reduced compared with the first embodiment, and therefore, the throughput is improved.

Figure 14:
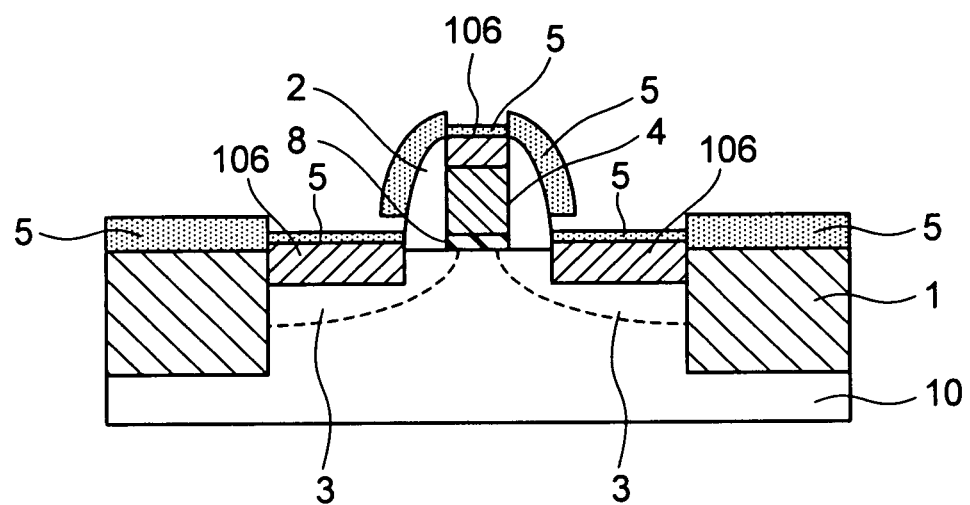
FIG. 14 is a cross-sectional view for illustrating different step in a semiconductor device manufacturing method according to the third embodiment.

In the case where the metal is not completely changed into a silicide by the first heating processing h1, the metal film 5 remains as shown in FIG. 14, for example.

The metal for silicidation is nickel (Ni), for example. Alternatively, the metal can be cobalt, iron or titanium, for example.

Furthermore, the metal film 5 can contain a noble metal, such as platinum (Pt) and palladium (Pd). If the metal film 5 contains such a noble metal, the composition of the silicide film to be formed later can be more easily controlled to be a desired composition (NiSi, for example) by a heating processing.

In this embodiment, it is assumed that the metal film 5 contains Pt. In this case, the metal (Ni) deposited by sputtering contains Pt.

The first heating processing h1 is carried out in a nitrogen atmosphere, for example. Thus, the silicide film (Ni silicide) 106 containing Pt is selectively formed on the source/drain diffusion layers 3 and the gate electrode 4, whereas the metal film (Ni) 5 on the surface of the device isolation insulating film 1 and the gate side walls 2 remains unreacted.

The first heating processing h1 includes a processing of heating the semiconductor substrate 10 with a hot plate that is carried out simultaneously with the sputtering, for example.

Furthermore, in the case where the metal film 5 remains as shown in FIG. 14, a heating processing that is continuous with the first heating processing h1 can be carried out (under the same conditions as the first heating processing h1, for example) in the apparatus (sputtering apparatus, for example) used for formation of the metal film 5 after the metal film 5 is formed and before the oxidation processing is carried out. For example, after the metal film 5 is formed and before the oxidation processing is carried out, the heating processing is carried out using a hot plate in the apparatus.

In this way, reaction between silicon in the source/drain diffusion layers 3 and the unreacted metal on the source/drain diffusion layers 3 is caused, and reaction between silicon in the gate electrode 4 and the unreacted metal on the gate electrode 4 is caused. Thus, the silicide film 106 having a predetermined thickness is formed, and the source/drain diffusion layers 3 and the gate electrode 4 that have a predetermined resistance value are formed.

In particular, in the case where the heating processing is carried out using a hot plate in the apparatus, the throughput can be improved compared with the case where the heating processing is carried out in an apparatus other than the apparatus used for formation of the metal film 5.

Then, at least the surface of the metal film 5 on the surface of the device isolation insulating film 1 and the gate side walls 2 is selectively oxidized (subjected to an oxidation processing) while preventing oxidation of the silicide film 106, thereby forming a metal oxide film 105 as shown in FIG. 13.

Specifically, an oxidation processing (thermal oxidation) is carried out in an oxidizing atmosphere at about 300 degrees C., for example, thereby oxidizing unreacted Ni on the surface of the device isolation insulating film 1 and the gate side walls 2 to form a Ni oxide film. In this processing, the whole of the unreacted metal (Ni) film 5 can be oxidized to form the metal oxide film, or only a surface part of the unreacted metal (Ni) film 5 can be oxidized to form the metal oxide film. The amount of the unreacted metal film 5 oxidized to form the metal oxide film can be determined based on the extent to which the thickness of the silicide film 106 in the vicinity of the boundary is reduced.

The oxidation processing is preferably carried out under such a condition that the silicide formed on the source/drain diffusion layers 3 is not oxidized, or is only slightly oxidized to the extent that the specific resistance of the silicide film 106 is not affected by the oxidation. The thermal oxidation processing at about 300 degrees C. described above meets the condition.

By forming the metal oxide film 105 by oxidizing at least the surface of the metal film 5 as described above, occurrence of migration of the metal (Ni) in a subsequent heating processing can be prevented.

For the oxidation processing, oxidation using a chemical solution containing an oxidant, such as ozone ($O_3$) water, (wet oxidation) can be used. Alternatively, oxidation using plasma oxygen can also be used for the oxidation processing. These processes can produce the metal oxide film 105 at a lower temperature than the thermal oxidation and thus can more effectively prevent oxidation of the silicide film 106.

The following procedure is the same as the procedure according to the first embodiment shown in FIGS. 5A to 5B. Thus, as in the first embodiment, migration of the metal for silicidation can be prevented, and the silicide film having a desired thickness can be formed. Thus, degradation of the junction leakage characteristics can be prevented, and a MISFET having desired characteristics can be produced.

Figure 15:
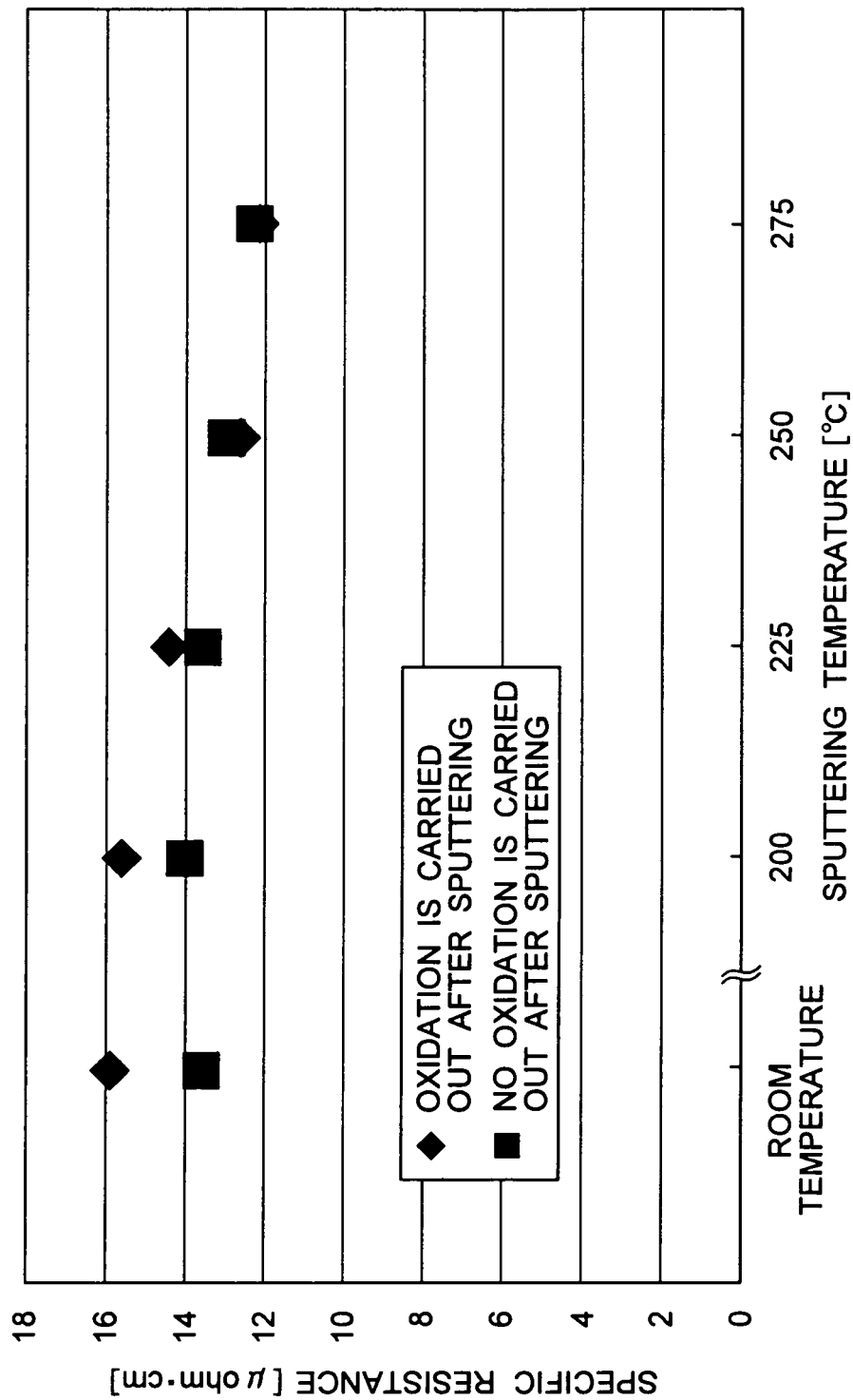
FIG. 15 is a graph showing relationships between the specific resistance of the Ni silicide film containing Pt formed on the silicon substrate by sputtering and the temperature of the first heating processing h1 during the sputtering.

FIG. 15 is a graph showing relationships between the specific resistance of the Ni silicide film containing Pt formed on the silicon substrate by sputtering and the temperature of the first heating processing h1 during the sputtering. In FIG. 15, the condition that oxidation is carried out after sputtering (this embodiment) means that a second heating processing h2 is carried out after the oxidation processing. The condition that no oxidation is carried out after sputtering (comparison example) means that the second heating processing h2 is carried out after sputtering without carrying out the oxidation processing.

As shown in FIG. 15, in the case where the temperature of the first heating processing h1 during sputtering is from room temperature to 200 degrees C., the specific resistance is higher in the case where the oxidation processing is carried out after the sputtering than in the case where the oxidation processing is not carried out after the sputtering.

That is, in the case where the temperature of the first heating processing h1 during sputtering is from room temperature to 200 degrees C., the unreacted metal is oxidized by the oxidation processing after the sputtering. Therefore, even if the second heating processing h2 is carried out after that, the silicide film is not formed to a predetermined thickness.

On the other hand, as shown in FIG. 15, in the case where the temperature of the first heating processing h1 during sputtering is from 225 degrees C. to 275 degrees C., the specific resistance for the condition that oxidation is carried out after sputtering is approximately equal to the specific resistance for the condition that no oxidation is carried out after sputtering.

That is, in the case where the temperature of the first heating processing h1 during sputtering is from 225 degrees C. to 275 degrees C., most of the metal reacts with silicon in the first heating processing h1, and therefore, there remains little unreacted metal to be oxidized in the oxidation processing. Thus, the silicide film is formed to the predetermined thickness in the subsequent second heating processing h2.

As described above, by carrying out the first heating processing h1 during sputtering for forming the metal film, a silicide film having a predetermined thickness can be formed.

As described above, according to the semiconductor device manufacturing method according to the third embodiment, a desired silicide film can be formed, and in particular, the junction leakage of a MISFET can be reduced.

Furthermore, according to the third embodiment, since the silicide film is formed simultaneously with the metal film, the number of steps is reduced compared with the first embodiment. That is, according to the third embodiment, the throughput can be improved, and the cost can be reduced.

According to the third embodiment, as in the first embodiment, it is essential only that the unreacted metal on the device isolation insulating film or the like is oxidized while preventing oxidation of the silicide film on the source/drain diffusion layer. Therefore, the metal is not limited to Ni or the like described above, and any metal that forms a metal oxide can be used. In addition, any metal that allows formation of a protective film containing Pt or Pd on the surface of the silicide film can be used.

What is claimed is:

1. A semiconductor device manufacturing method for forming a MISFET, comprising:
   forming a metal film containing platinum by depositing a metal on a source/drain diffusion layer primarily made of silicon formed on a semiconductor substrate and on a device isolation insulating film formed on the semiconductor substrate adjacent to the source/drain diffusion layer;

forming a silicide film by silicidation of an upper part of the source/drain diffusion layer by causing a reaction between silicon in the source/drain diffusion layer and the metal on the source/drain diffusion layer by a first heating processing at a first heating temperature;

forming a metal oxide film by an oxidation processing to oxidize selectively at least a surface of the metal film on the device isolation insulating film;

heating the silicide film by a second heating processing at a second heating temperature higher than the first heating temperature; and selectively removing the metal oxide film and an unreacted part of the metal film on the device isolation insulating film.

2. The semiconductor device manufacturing method according to claim 1, wherein the first heating processing, the oxidation processing and the second heating processing are carried out in the same chamber.

3. The semiconductor device manufacturing method according to claim 1, wherein the oxidation processing is a thermal oxidation.

4. The semiconductor device manufacturing method according to claim 3, wherein a temperature of the thermal oxidation is lower than the second heating temperature.

5. The semiconductor device manufacturing method according to claim 1, wherein the source/drain diffusion layer contains germanium or carbon.

6. The semiconductor device manufacturing method according to claim 1, wherein the metal oxide film and the unreacted part of the metal film are selectively removed by using any of sulfuric acid-hydrogen peroxide, nitric acid-hydrogen peroxide, aqua regia and hydrochloric acid-hydrogen peroxide.

7. The semiconductor device manufacturing method according to claim 1, wherein the metal is any of nickel, cobalt, iron and titanium.

8. The semiconductor device manufacturing method according to claim 1, wherein the first heating processing and the oxidation processing are carried out at the first heating temperature and the second heating processing is carried out at the second temperature higher than the first heating temperature.

9. The semiconductor device manufacturing method according to claim 1, wherein an oxygen concentration of the first heating processing is lower than an oxygen concentration of the oxidation processing, and the oxygen concentration of the oxidation processing is higher than an oxygen concentration of the second heating processing.

10. The semiconductor device manufacturing method according to claim 1, wherein the first heating processing is carried out in an atmosphere the oxygen concentration of which is equal to or lower than 1%.

11. The semiconductor device manufacturing method according to claim 1, wherein the oxidation processing is carried out with an oxygen concentration of 100%.

12. A semiconductor device manufacturing method for forming a MISFET, comprising:

forming a metal film containing platinum by depositing a metal on a source/drain diffusion layer primarily made of silicon formed on a semiconductor substrate and on a device isolation insulating film formed on the semiconductor substrate adjacent to the source/drain diffusion layer and forming a silicide film by silicidation of an upper part of the source/drain diffusion layer by causing a reaction between silicon in the source/drain diffusion layer and the metal on the source/drain diffusion layer by a first heating processing at a first heating temperature;

forming a metal oxide film by an oxidation processing to oxidize selectively at least a surface of the metal film on the device isolation insulating film;

heating the silicide film by a second heating processing at a second heating temperature higher than the first heating temperature; and selectively removing the metal oxide film and an unreacted part of the metal film on the device isolation insulating film.

13. The semiconductor device manufacturing method according to claim 12, wherein an oxygen concentration of the first heating processing is lower than an oxygen concentration of the oxidation processing, and the oxygen concentration of the oxidation processing is higher than an oxygen concentration of the second heating processing.

14. The semiconductor device manufacturing method according to claim 12, wherein the oxidation processing and the second heating processing are carried out in the same chamber.

15. The semiconductor device manufacturing method according to claim 12, wherein the oxidation processing is a thermal oxidation.

16. The semiconductor device manufacturing method according to claim 15, wherein a temperature of the thermal oxidation is lower than the second heating temperature.

17. The semiconductor device manufacturing method according to claim 12, wherein the metal oxide film and the unreacted part of the metal film are selectively removed by using any of sulfuric acid-hydrogen peroxide, nitric acid-hydrogen peroxide, aqua regia and hydrochloric acid-hydrogen peroxide.

18. The semiconductor device manufacturing method according to claim 12, wherein the metal is any of nickel, cobalt, iron and titanium.

19. The semiconductor device manufacturing method according to claim 12, wherein, when the metal film is formed, the metal film is heated by the first heating processing.

20. The semiconductor device manufacturing method according to claim 12, wherein the first heating processing is performed using a hot plate.

* * * * *